(12) United States Patent
Rief et al.

(10) Patent No.: US 11,821,069 B2
(45) Date of Patent: Nov. 21, 2023

(54) METHOD OF MAKING A DECORATIVE ARTICLE, SUCH AS A JEWELLERY PIECE

(71) Applicant: D. Swarovski KG, Wattens (AT)

(72) Inventors: Alexander Rief, Hong Kong (CN); Thomas Rauch, Innsbruck (AT); Jan Woerdenweber, Innsbruck (AT)

(73) Assignee: D. Swarovski KG, Wattens (AT)

( * ) Notice: Subject to any disclaimer, the term of this patent is extended or adjusted under 35 U.S.C. 154(b) by 0 days.

(21) Appl. No.: 17/056,241

(22) PCT Filed: May 17, 2019

(86) PCT No.: PCT/EP2019/062874
§ 371 (c)(1),
(2) Date: Nov. 17, 2020

(87) PCT Pub. No.: WO2019/219944
PCT Pub. Date: Nov. 21, 2019

(65) Prior Publication Data
US 2021/0219679 A1 Jul. 22, 2021

(30) Foreign Application Priority Data

May 18, 2018 (EP) .................................... 18173372

(51) Int. Cl.
*C23C 14/58* (2006.01)
*C23C 14/08* (2006.01)
(Continued)

(52) U.S. Cl.
CPC .......... *C23C 14/5873* (2013.01); *A44C 17/04* (2013.01); *A44C 27/006* (2013.01);
(Continued)

(58) Field of Classification Search
CPC . C23C 14/0015; C23C 14/081; C23C 14/185; C23C 14/5873; A44C 27/006;
(Continued)

(56) References Cited

U.S. PATENT DOCUMENTS 4,737,252 A * 4/1988 Hoffman .............. A44C 27/005
204/192.16
9,820,538 B2 * 11/2017 Lebreton ................ A44C 17/02
(Continued)

FOREIGN PATENT DOCUMENTS

CH          493224 A     7/1970
CN       101610895 A    12/2009
(Continued)

OTHER PUBLICATIONS

Machine Translation JP-05156425-A (Year: 1993).*
(Continued)

*Primary Examiner* — Michael A Band
(74) *Attorney, Agent, or Firm* — Stevens & Showalter LLP

(57) ABSTRACT

A method of making a decorative article (1) such as a jewellery piece, the article comprising a body (2) having a decorative layer (5) and an element (3) set into the body. The method comprises: providing an element that is at least partially coated with a removable layer (4), setting the element into the body, coating the element and the body with the decorative layer, and removing the removable layer and the decorative layer from the element.

16 Claims, 4 Drawing Sheets

(51) Int. Cl.
  *C23C 14/18* (2006.01)
  *A44C 17/04* (2006.01)
  *A44C 27/00* (2006.01)
  *C23C 14/00* (2006.01)

(52) U.S. Cl.
  CPC ........ *A44C 27/007* (2013.01); *C23C 14/0015* (2013.01); *C23C 14/081* (2013.01); *C23C 14/185* (2013.01)

(58) Field of Classification Search
  CPC ..... A44C 27/007; A44C 27/005; A44C 17/04; A44C 17/043; A44C 17/046
  See application file for complete search history.

(56) References Cited

U.S. PATENT DOCUMENTS

| 10,743,625 | B2 * | 8/2020 | Bourban ................ C25D 5/022 |
| 2002/0176988 | A1 | 11/2002 | Medwick et al. |
| 2003/0226424 | A1 | 12/2003 | Nishii et al. |
| 2008/0066310 | A1 | 3/2008 | Pang |

FOREIGN PATENT DOCUMENTS

| CN | 102337568 | A | 2/2012 | |
| CN | 101404909 | B | 6/2012 | |
| CN | 104486964 | A | 4/2015 | |
| GB | 8926310 | A | 11/1989 | |
| GB | 2501763 | A | 11/2013 | |
| JP | 05156425 | A * | 6/1993 | ............. G04B 19/12 |
| TW | 234281 | U | 11/1994 | |
| WO | 2010081557 | A1 | 7/2010 | |
| WO | 2017005285 | A1 | 1/2017 | |

OTHER PUBLICATIONS

Giuseppe Di Miceli; International Search Report and Written Opinion; PCT Application No. PCT/EP2019/062874; dated Jul. 16, 2019; European Patent Office; Rijswijk, Netherlands.

Aparicio Contreras; Extended European Search Report; European Patent Application No. 18173372.6; dated Nov. 30, 2018; European Patent Office; Munich, Germany.

First Search dated Feb. 17, 2022; Chinese Application No. 201980033581.X; The State Intellectual Property Office of People's Republic of China.

The First Office Action dated Feb. 24, 2022; Chinese Application No. 201980033581.X; The State Intellectual Property Office of People's Republic of China.

Taiwanese Examination Report dated Jun. 7, 2022; Taiwanese Application No. 108116553; Taiwan Intellectual Property Office; Taipei City, Taiwan.

Office Action dated Aug. 25, 2022; Chinese Application No. 201980033581X; China National Intellectual Property Office; Beijing, China.

Appelen, Annik; Decision to Grant dated Jan. 18, 2023; p. 10; European Application No. 19728894.7; European Patent Office; Netherlands.

Hong, Tran Le; Vietnamese Office Action dated May 31, 2023; Vietnamese Application No. 1-2020-06975; Intellectual Property Office of Vietnam; Hanoi, Vietnam.

Zhicheng, Xu; Taiwan Office Action dated Jul. 28, 2023; Taiwan Application No. 108116553; Intellectual Property Bureau of the Ministry of Economic Affairs; Taipei City, Taiwan.

* cited by examiner

METHOD OF MAKING A DECORATIVE ARTICLE, SUCH AS A JEWELLERY PIECE

FIELD OF THE INVENTION

The present disclosure relates to a method of making an article, such as a jewellery piece, the article comprising a body having a decorative layer and an element set into the body.

INTRODUCTION

Decorative articles such as jewellery pieces in which a body of a first material is coated with a decorative layer are well-known. Such decorative layers are commonly used, for example, to give the appearance that an article is made from an expensive 'precious metal', whilst allowing a bulk of the article to be made from a less costly material. It is also common to set such decorative articles with elements such as crystals and precious or semi-precious stones.

Where a jewellery piece is both coated with a decorative layer and set with an element, it is well known to first coat the body of the jewellery piece with a decorative layer, and then to set the element into the coated body after coating. A common way of coating a jewellery piece with a decorative layer and subsequently setting a stone into the jewellery piece is as follows.

Firstly, a body of the jewellery piece is manufactured with a cavity for the element and with at least one closable projection in the vicinity of the cavity, such as a bezel or prong, for securing the stone to the jewellery piece. Bodies are commonly fabricated from metals including bronze, brass, aluminium, stainless steel, silver and alloys.

Secondly, the body, including the projection, is coated with the decorative layer. After coating, the element is placed into the cavity, and the closable projection is closed by bending or otherwise deforming the projection over the element with a pusher, thus setting the element into the body, and forming the completed jewellery piece.

A disadvantage associated with the above-stated method lies in the closing of the closable projection with the pusher. In closing the projection in this way, it is likely that the decorative layer will be damaged, particularly in the region of the projection, by impact of the pusher against the decorative layer and/or by the deformation of the projection. The larger the element that is set into the body, the greater the damage to the decorative layer during the setting of the element into the body, meaning that the damage to the decorative layer is particularly apparent with larger elements.

Until now, a small amount of visible damage to the decorative layer in the region of the closable projection has been tolerated; however, it would be desirable to avoid this damage to the decorative layer to improve the overall quality of the article. To the same end, it would also be desirable to avoid damage to the element during transportation and processing of the element and the jewellery piece.

The process according to the present invention aims to solve at least some of the problems associated with the prior art.

SUMMARY OF THE INVENTION

From a first aspect, the invention resides in a method of making an article comprising a body having a decorative layer and an element set into the body. The method comprises: providing an element at least partially coated with a removable layer, setting the element into the body, coating the element and the body with the decorative layer, and removing the removable layer and the decorative layer from the element.

The removable layer acts to shield the element from direct coating with the decorative layer, and can be removed to leave the element free from any coated layers. As a result, the removable layer permits a jewellery piece to be covered with a decorative layer after an element has been set into the body of the jewellery piece. In this way, there is no need to carry out any setting of the element after the decorative layer has been applied, and damage to the decorative layer that would otherwise take place during setting of the element can be avoided.

The body may comprise an element-receiving region and a projection that is closable over the element-receiving region, and the step of setting the element into the body may comprise placing the element into the element-receiving region and closing the projection over the element.

Such a projection provides a particularly suitable means for setting an element. If the projection were closed after the decorative layer were applied, the decorative layer would be particularly vulnerable to damage in the region of the projection as the projection is closed; however, because the projection is closed before the article is covered with the decorative layer, the projection of the body may remain evenly coated with an undamaged decorative layer in the finished article.

The step of closing the projection over the element may comprise deforming the projection. This may be done by means of a pusher.

The removable layer may comprise a layer selected from the group of: a metal layer (in particular a layer of magnesium (Mg) or a layer of aluminium (Al)), an oxide layer (in particular a layer of magnesium oxide (MgO) or a layer of silicon dioxide ($SiO_2$)), a layer of polyvinyl alcohol (PVA) or a layer of carbon. Such materials are particularly appropriate as removable layers since they provide adequate shielding but are removable under appropriate conditions.

The removable layer may comprise at least two layers. When the removable layer comprises at least two layers, each layer may be selected from the group of: a layer of magnesium (Mg), a layer of magnesium oxide (MgO), and a layer of silicon dioxide ($SiO_2$).

The step of providing an element that is at least partially coated with a removable layer may comprise at least partially coating an element with a removable layer. This coating stage may be carried out using physical vapour deposition (PVD), such as sputtering.

The step of coating the element with the removable layer may comprise: coating the element with a layer of a metal (A), and coating the element with a layer of an oxide.

The oxide may be an oxide of the metal ($A_xO_y$); for example, the metal (A) may be magnesium (Mg) and the oxide may be Magnesium Oxide (MgO). The step of coating the element with the layer of the metal (A) may comprise using physical vapour deposition (PVD) to deposit the metal (A) on the element in a vacuum chamber and the step of coating the element with the layer of the oxide of the metal ($A_xO_y$) may comprise introducing oxygen into the vacuum chamber after the metal (A) has been deposited.

The metal (A) may be magnesium (Mg) and the oxide may be silicon dioxide ($SiO_2$). Alternatively, the metal (A) may be magnesium (Mg) and the oxide may be silicon dioxide ($SiO_2$).

The removable layer may have a maximum thickness between 5 nm and 7 μm. The removable layer may preferably have a maximum thickness between 5 nm and 1 μm, particularly when the removable layer comprises a layer of metal (A) or a layer of an oxide.

When the removable layer comprises two or more layers, the or each layer may have a maximum thickness between approximately 25 nm and approximately 500 nm.

When the removable layer comprises a layer of magnesium (Mg), the layer of magnesium (Mg) may have a maximum thickness between approximately 25 nm and approximately 200 nm, preferably approximately 100 nm.

When the removable layer comprises a layer of magnesium oxide (MgO), the layer of magnesium oxide (MgO) may have a maximum thickness between approximately 25 nm and approximately 500 nm, preferably approximately 100 nm.

When the removable layer comprises a layer of silicon dioxide ($SiO_2$), the layer of silicon dioxide ($SiO_2$) may have a maximum thickness between approximately 25 nm and approximately 200 nm, preferably approximately 100 nm.

When the removable layer comprises a layer of aluminium (Al), the layer of aluminium (Al) may have a maximum thickness of between approximately 50 nm and approximately 300 nm, preferably approximately 150 nm.

When the removable layer comprises a layer of polyvinyl alcohol (PVA), the layer of polyvinyl alcohol (PVA) may have a maximum thickness of between approximately 3 μm and 7 μm, preferably approximately 5 μm.

The decorative layer may be selected from the group of: a rose gold decorative layer (i.e. a gold-copper alloy layer), a diamond-like carbon (DLC) decorative layer, a titanium nitride (TiN) decorative layer, a metallic silicon decorative layer, a silicon dioxide ($SiO_2$), gold (Au), silicon dioxide ($SiO_2$) decorative layer, a titanium carbide (TiC) decorative layer, a zirconium nitride decorative layer, a chromium (Cr) decorative layer, a gold (Au) decorative layer, a gold-copper (Au—Cu) alloy decorative layer, a silver (Ag) decorative layer, a copper (Cu) decorative layer, an iron (III) oxide $Fe_2O_3$ decorative layer, or a silicon dioxide ($SiO_2$) decorative layer.

When the decorative layer is a rose gold decorative layer, the step of coating the element and the body with the rose gold decorative layer may comprise: coating the element and the body with a titanium nitride (TiN) decorative sublayer, optionally coating the element and the body with a gold (Au) decorative sublayer, and coating the element and the body with a gold-copper (Au—Cu) alloy decorative sublayer.

The titanium nitride (TiN) decorative sublayer of the rose gold coating may have a maximum thickness of between approximately 130 nm and 170 nm, preferably approximately 150 nm, and the gold-copper (Au—Cu) alloy decorative sublayer may have a maximum thickness of between approximately 130 nm and 170 nm, preferably approximately 150 nm. Hence, the rose gold decorative layer may have a maximum thickness between approximately 260 nm and 340 nm, preferably approximately 300 nm.

In other embodiments, the rose gold decorative layer may further comprise a gold decorative sublayer between the titanium nitride (TiN) decorative sublayer and the gold-copper (Au—Cu) alloy decorative sublayer. In this case, the titanium nitride (TiN) decorative sublayer may have a maximum thickness of between approximately 130 nm and 170 nm, preferably approximately 150 nm, the gold (Au) decorative sublayer may have a maximum thickness of between approximately 30 nm and 50 nm, preferably approximately 40 nm, and the gold-copper (Au—Cu) alloy decorative sublayer may have a maximum thickness of between approximately 90 nm and 110 nm, preferably approximately 100 nm. Hence, the rose gold decorative layer may have a maximum thickness between approximately 250 nm and 330 nm, preferably approximately 290 nm.

The gold-copper alloy may have a gold:copper ratio of approximately 40:60 by weight. When the decorative layer is a diamond-like carbon (DLC) decorative layer, the step of coating the element and the body with the diamond-like carbon (DLC) decorative layer may comprise: coating the element and the body with a titanium carbide (TiC) decorative sublayer, and coating the element and the body with a carbon (C) decorative sublayer.

In this case, the titanium nitride (TN) decorative sublayer may have a maximum thickness between approximately 375 nm and 425 nm, preferably approximately 400 nm, and the carbon (C) decorative sublayer may have a maximum thickness between approximately 225 nm and 275 nm, preferably approximately 250 nm. Hence, the diamond-like carbon (DLC) decorative layer may have a maximum thickness between approximately 600 nm and 700 nm, preferably approximately 650 nm.

When the decorative layer is a titanium nitride (TiN) decorative layer, the decorative layer may have a maximum thickness of between approximately 750 nm and 850 nm, preferably approximately 800 nm.

When the decorative layer is a metallic silicon decorative layer, the decorative layer may have a maximum thickness between approximately 1100 nm and 1300 nm, preferably approximately 1200 nm.

The decorative layer may comprise silicon dioxide ($SiO_2$), and gold (Au) sub-layers, for example in an $SiO_2$, Au, $SiO_2$ arrangement. In this case each silicon dioxide ($SiO_2$) decorative sublayer may have a maximum thickness between approximately 0.16 μm and 0.23 μm, preferably approximately 0.2 μm, and the gold decorative sublayer may have a maximum thickness between approximately 0.16 μm and 0.23 μm, preferably approximately 0.2 μm. Hence, the decorative layer may have a maximum thickness between approximately 0.5 μm and 0.7 μm, preferably approximately 0.6 μm.

The step of removing the removable layer and the decorative layer from the element may comprise soaking the element in a soaking liquid, which may comprise soaking the jewellery piece in the soaking liquid. Soaking in a soaking liquid provides a particularly simple method of removing the removable layer, which requires minimal manual work.

The soaking liquid may be water, an acid or a base, and may preferably be one of the group of: water, a citric acid solution, a nitric acid ($HNO_3$) solution, a sodium hydroxide (NaOH) solution, or a salicylic acid solution, for example a Bayer Aspirin™ salicylic acid solution.

When the soaking liquid is a citric acid solution, the citric acid solution may be a weak citric acid solution. In this case, the weak citric acid solution may have a concentration between approximately 0.9 g/L to 1.1 g/L, preferably approximately 1 g/L.

In other embodiments, the citric acid solution may be a strong citric acid solution. In this case, the strong citric acid solution may have a concentration between approximately 1.9 g/L to 2.1 g/L, preferably approximately 2 g/L.

Embodiments are also envisaged in which the citric acid solution is a very strong citric acid solution. In this case, the very strong citric acid solution may have a concentration between approximately 4.9 wt % to 5.1 wt %, preferably approximately 5 wt %.

When the soaking liquid is a nitric acid solution, the nitric acid solution may be a weak nitric acid ($HNO_3$) solution. In this case, the weak nitric acid (HNO$_3$) solution may have a concentration between approximately 1.9% to 2.1%, preferably approximately 2%.

In other embodiments, the nitric acid solution may be a strong nitric acid (HNO$_3$) solution. In this case, the strong nitric acid (HNO$_3$) solution may have a concentration between approximately 9% to 11%, preferably approximately 10%.

Embodiments are also envisaged in which the nitric acid solution is a very strong nitric acid (HNO$_3$) solution. In this case, the very strong nitric acid (HNO$_3$) solution may have a concentration between approximately 19% to 21%, preferably approximately 20%.

When the soaking liquid is a sodium hydroxide solution, the sodium hydroxide solution may have a concentration between approximately 0.04M/L and 0.06M/L, preferably approximately 0.05 M/L.

When the soaking liquid is a Bayer Aspirin™ salicylic acid (or salicylic acid) solution, the Bayer Aspirin™ salicylic acid (or salicylic acid) solution may be a weak Bayer Aspirin™ salicylic acid (or salicylic acid) solution, in which case, the weak Bayer Aspirin™ salicylic acid (or salicylic acid) solution may have a concentration between approximately 0.9 g/L to 1.1 g/L, preferably approximately 1 g/L.

In other embodiments, the Bayer Aspirin™ salicylic acid (or salicylic acid) solution may be a strong Bayer Aspirin™ salicylic acid (or salicylic acid) solution, in which case the weak Bayer Aspirin™ salicylic acid (or salicylic acid) solution may have a concentration between approximately 9 g/L to 11 g/L, preferably approximately 10 g/L.

The method may further comprise a step of cleaning the element after the step of removing the removable layer and the decorative layer from the element. An additional cleaning step may remove any residual pieces of the removable layer, and also any residue from the soaking liquid, to ensure that the element is clean and has an optimal aesthetic appearance. For example, the step of cleaning the element may comprise cleaning the element with soapy water and/or exposing the element to jet of water.

The element may be a jewellery element, and may preferably be one of the group comprising cubic zirconia (CZ), glass, a rhinestone a semi-precious stone and a precious stone.

The body may substantially be made of a material selected from the group of stainless steel, titanium, aluminium, brass, bronze, silver, polyamides and an alloy.

The article may be a decorative article, and may in particular be a jewellery piece.

The invention also extends to a settable element for setting into an article, the settable element being coated with a removable layer.

The settable element may be a jewellery element, and may preferably be one of the group comprising cubic zirconia (CZ), glass, a rhinestone a semi-precious stone and a precious stone. The removable layer may comprise one or more layers selected from the group of: a metal layer (in particular a layer of magnesium (Mg) or a layer of aluminium (Al)), an oxide layer (in particular a layer of magnesium oxide (MgO) or a layer of silicon dioxide (SiO$_2$)), a layer of polyvinyl alcohol (PVA) or a layer of carbon. In a particularly preferred embodiment, the settable element is a cubic zirconia crystal, and the removable layer comprises a layer of magnesium and a layer of silicon dioxide.

The invention extends further to a method of coating a settable element, the method comprising: providing a settable element and coating the settable element with a removable layer.

Features of any one aspect or embodiment of the invention may be used, alone or in appropriate combination, with other aspects and embodiments as appropriate.

BRIEF DESCRIPTION OF THE DRAWINGS

FIG. 1B is a cross-sectional view of an element forming part of the jewellery piece of FIG. 1a.

FIGS. 2 to 6 illustrate steps in a method of making the jewellery piece of FIG. 1a, in which:

FIG. 2 is a cross-sectional view of the element of FIG. 1B, the element having been coated with a removable layer;

FIG. 3 is a cross-sectional view of an uncoated jewellery piece with the element of FIG. 2 placed in a cavity of jewellery piece;

FIG. 4 is a cross-sectional view of the jewellery piece of FIG. 3, with the element having been secured to the jewellery piece;

FIG. 5 is a cross-sectional view of the jewellery piece of FIG. 4, with the jewellery piece having been coated with a decorative layer;

FIG. 6 is a cross-sectional view the jewellery piece of FIG. 5, with the removable layer and the decorative layer having been removed from the element.

DETAILED DESCRIPTION OF EMBODIMENTS OF THE INVENTION

Figure 1A:
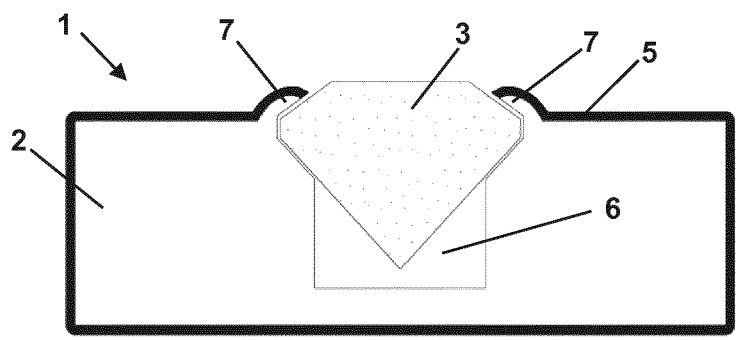
FIG. 1a is a cross-sectional view of a jewellery piece.

FIG. 1a illustrates an article, exemplified as a jewellery piece 1, comprising a body 2 having a decorative layer 5 and an element 3 set into the body 2.

The body 2 comprises an element-receiving region, exemplified as a cavity 6 in FIG. 1a, that holds an element 3. The body 2 further comprises one or more projections, exemplified as two prongs 7 in FIG. 1a, for securing the element 3 to the body 2 of the jewellery piece 1. In FIG. 1a, the prongs 7 are closed over the cavity 6 and the element 3, so as to secure the element 3 to the body 2 of the jewellery piece 1.

In this particular example, the body is made substantially of stainless steel, though the body may be made of any suitable material such as titanium, aluminium, brass, bronze, silver, another metal, which may for example be a suitable alloy, or a plastics material such as, for example, a polyamide.

The body 2 is coated with a decorative layer 5 to enhance the aesthetic appeal of the jewellery piece. The decorative layer 5 may comprise a single layer of any suitable material, or it make comprise a plurality of decorative sublayers, each of any suitable material, which when layered together give a particular visual effect. In this example, the decorative layer 5 is a rose gold decorative layer, comprising two decorative sub-layers: a base titanium nitride (TiN) decorative sublayer and an outer gold-copper (Au—Cu) alloy decorative sublayer. The decorative layer 5 may also provide the body 2 with functional benefits, such as enhanced corrosion resistance or wear resistance.

Figure 1B:
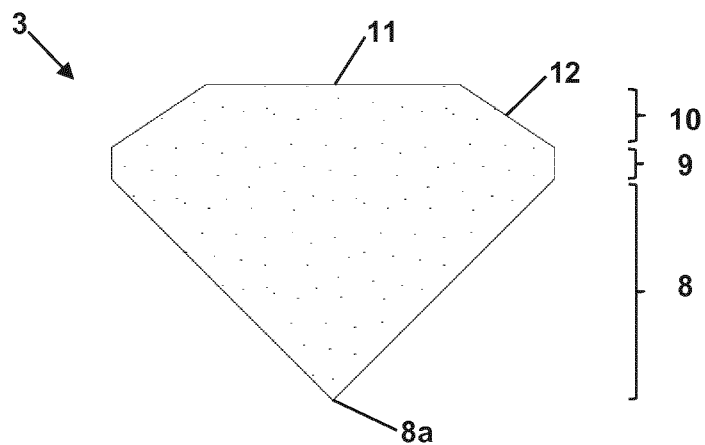

FIG. 1B illustrates the element 3 in isolation. The element 3 in the example illustrated is a jewellery element comprising a cubic zirconia (CZ) crystal, but may be any element capable of being set into the body 2, such as a crystal or bead of glass, a rhinestone, a precious or semi-precious stone or any other conceivable element. Where the element 3 is a crystal or cut element, the element 3 may be of any conceivable cut including, but not limited to, a brilliant cut.

The element 3 of FIG. 1B comprises a pavilion 8, a girdle 9 and a crown 10. The pavilion 8 defines a tip 8a. The crown 10 defines a table 11 that lies directly opposite the tip 8a of the pavilion 8. Inclined facets 12 of the crown 10 extend between the table and the girdle 9. Referring back to FIG. 1a, wherein the element is set into the body 2 of the jewellery piece 1, the crown 10 of the element 3 protrudes from the body 2.

A method of setting the element 3 in the body 2 of the jewellery piece 1 will now be described with reference to FIGS. 2 to 6.

Figure 2:
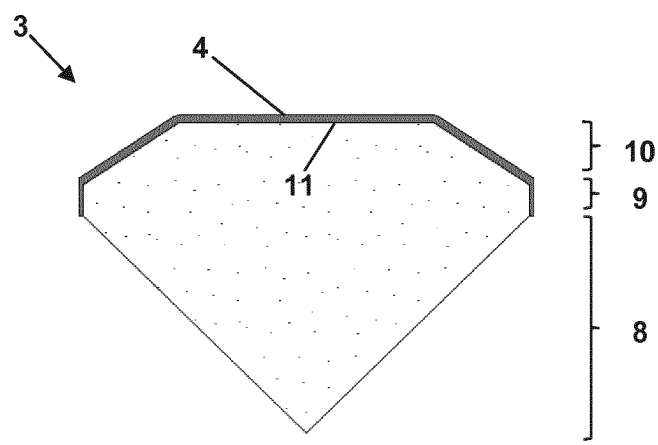

FIG. 2 illustrates the first step of the method according to the invention, wherein an element 3 coated with a removable layer 4 is provided. The removable layer 4 is a coating which acts as a shield and protects the element 3, e.g. from corrosion, wear and direct contact with other materials, but which is readily removed under specific conditions. In this example, the removable layer 4 is applied to the element using physical vapour deposition (PVD).

This deposition stage may be carried out in the same location as the subsequent stages of the method now described. However, it is also envisaged that the deposition stage may be carried out off site, and the element may therefore be provided with the removable layer pre-applied.

Figure 3:
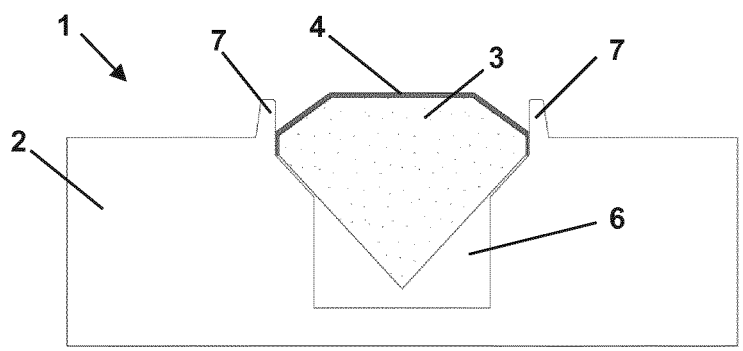
Figure 4:
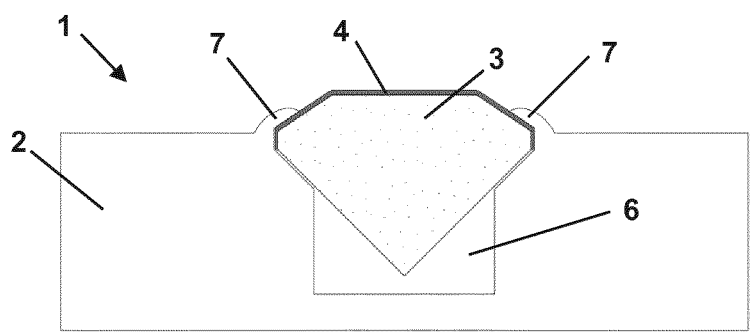

FIGS. 3 and 4 illustrate the second step of the method of setting the element 3 in the body 2 of the jewellery piece 1. To set the element, referring to FIG. 3, the element 3 is first placed into the cavity 6 of the body 2. Thereafter, referring to FIG. 4, the two prongs 7 are closed over the element 2 so as to secure the element 2 to the body 2 of the jewellery piece 1. This may be done by using a prong pusher (not shown) to deform the two prongs 7.

At this setting stage, the body 2, including the two prongs 7, is uncoated. As a result, any damage that occurs during the setting process is borne by the material of the underlying body 2.

Figure 5:
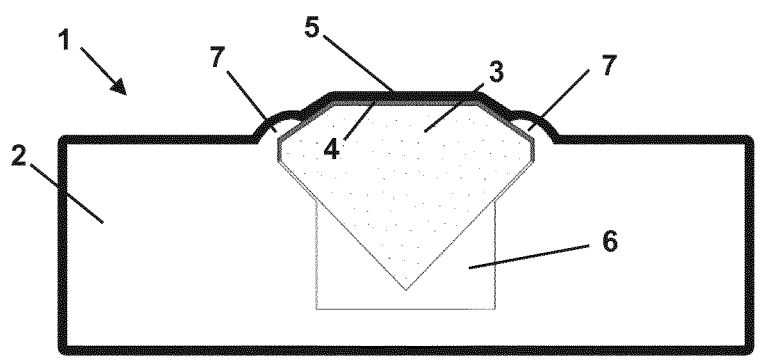

FIG. 5 illustrates the third step of the method in which the jewellery piece 1, comprising the body 2 and the element 3, is coated with the decorative layer 5. The presence of the removable layer 4 means that the decorative layer 5 does not contact the element 3 directly, but is instead applied over the removable layer 4 on the element 3. Because the decorative layer 5 is not applied until after the setting stage, the decorative layer 5 may cover up any minor damage that might have been caused to the underlying body 2, leaving a flawless decorative layer 5 in place.

In the fourth step, the removable layer 4 is removed from the element 3, taking with it any part of the decorative layer 5 that has been coated on the element 3. The removable layer 4 and the decorative layer 5 may be removed from the element 3 for example by soaking the jewellery piece 1 in a soaking liquid. In doing so, the removable layer 4 and the decorative layer 5 dissolve (or decompose) into the soaking liquid, thus revealing the uncoated element 3. To remove any residue, the jewellery piece 1, in particular the element 3, may then be cleaned, for example with soapy water and/or by exposing the element to a jet of water.

Figure 6:
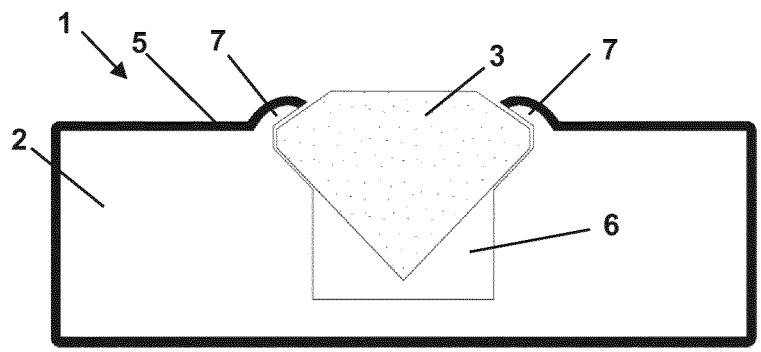

FIG. 6 illustrates the jewellery piece 1 after the removable layer 4 and the decorative layer 5 have been removed from the element 3. The element 3 is free from any decorative layer. The body 2 has a decorative layer 5 in place and because the decorative layer 5 has been applied after the element 3 has been set in the body 2, the decorative layer 4 remains entirely undamaged, most notably in the region of the two prongs 7.

The removable layer 4 thereby provides a simple and cost effective way of improving the integrity of the decorative layer 5 in the finished article.

In addition, the removable layer 4 provides a means protecting the element 3 and the body 2 of the jewellery piece 1 during the production and transportation of the jewellery piece 1.

During transportation and storage of isolated elements 3, it is often beneficial that the isolated elements 3 be packed close together to conserve space. The removable layer 4, guards against damage to each element 3 that might otherwise be caused if the elements contact each other during transportation. Elements 3 are also protected in the same way during the transportation and storage of completed jewellery pieces 1 into which the elements 3 have been set.

During the setting of the element 3 into the body 2 of the jewellery piece 1, the removable layer 4 additionally protects the element 3 as it is handled. For example, should the prong pusher accidentally strike the element 3 during the setting process, the removable layer 4 will be struck first, thus preserving the condition of the element 3.

The removable layer 4 therefore protects the element 4 during the transportation or storage of an isolated element 3, during the setting of the element 3 into the body 2 of the jewellery piece 1, as well as during the transportation or the storage of the completed jewellery piece 1.

The removable layer 4 can be removed at any convenient time. For example, if the jewellery piece 1 is to be displayed shortly after the decorative coating 5 is applied without the need for subsequent transportation, it may be desirable to remove the removable layer 4 immediately after the coating step.

Alternatively, if the jewellery piece 1 is to undergo transportation prior to its display, for example by shipping the jewellery piece 1 from a point of manufacture to a point of sale where it will be displayed, the removable layer 4 may remain in place for transportation. Immediately before the completed jewellery piece 1 is displayed, the removable layer 4 and the decorative layer 5 may easily be removed from the element 3 by soaking the jewellery piece 1 in a soaking liquid, revealing the element 3 intact. Where the jewellery piece undergoes shipping to an end customer, this removal stage may even be performed by the end customer, thus precluding any damage to the element 3 up until the moment the customer decides to remove the removable layer 4 and the decorative layer 5.

Removable Layer

Turning in more detail to the removable layer 4, the removable layer 4 may be any layer that is capable of shielding the element 3 from direct contact with the decorative layer 5, and that can be easily and safely removed when required.

In the embodiment of FIG. 2, the removable layer 4 comprises a single layer of material.

Removable layers 4 comprising certain salts, soluble organic and inorganic compounds, easily soluble metals, as well as moisture-sensitive carbides or nitrides are preferred. Particularly preferred compositions of removable layers are specified below: usable ranges of maximum thicknesses, as well as a preferable maximum thickness, for such removable layers, are also provided.

Where the removable layer comprises a single layer, suitable layer materials may be for example magnesium (Mg), magnesium oxide (MgO), silicon dioxide ($SiO_2$), aluminium (Al), polyvinyl alcohol (PVA), or any other suitable material.

To conserve materials, it can be beneficial to apply removable layer 4 only to the parts of the element 3 which must be visible after the element 3 is set into the body 2. As such, in the embodiment of FIG. 2, only the girdle 9 and the crown 10 of the element 3 are coated with the removable layer 4. Thus, it is not necessarily required that the entire element be coated with the removable layer: only the areas that would otherwise be exposed to the decorative layer during subsequent stages.

The removable layer 4 may be applied by means of any suitable process, such as, for example, a physical vapour deposition (PVD) process. PVD processes are a group of vacuum deposition processes that may be used to produce thin films and coatings, and include, for example, sputtering.

In a PVD process, the element 3 and the material of the or each layer of the removable layer 4 is usually placed in a vacuum chamber (not shown) in a system configured to perform PVD (also not shown). The material is first transitioned into a vapour phase. The source, i.e. the vaporised material, is subsequently led to the substrate, e.g. the element 3, where it condenses and forms a film, i.e. the removable layer 4 or one layer thereof.

PVD processes are advantageous since they allow a large number of different coating layers to be deposited in a very pure form in thin layers on a substrate. Sputtering may, for example, be a particularly suitable form of PVD.

Another way in which an element 3 may be coated with a removable layer 4 is by means of chemical vapour deposition (CVD). Typically, in CVD the substrate, e.g. the element 3, is exposed to one or more volatile precursors in a reaction chamber (not shown) of a system configured to perform CVD (also not shown). The one or more volatile precursors react and/or decompose on the substrate surface to produce the desired deposit, e.g. the removable layer 4. Frequently, volatile by-products are also produced, which are removed by gas flow from the reaction chamber.

Where the removable layer is a PVA layer, the layer may be applied to the element by direct application, for example by immersion in a PVA solution It may be desirable to select the material of the removable layer according to the material of the body and/or decorative layer. For example, if an element 3 is to be set into a body 2 comprising an acid-sensitive metal, or into a body to which an acid-sensitive decorative layer will be applied, the removable layer must be easily removable without the use of acid. In this case, magnesium (Mg) is a preferable material for the removable layer, since it can be removed without the need for acid.

Oxides such as magnesium oxide (MgO) are typically less sensitive than magnesium (Mg) to water, and hence a removable layer 4 of magnesium oxide (MgO) may be preferred if the jewellery piece is likely to be exposed to humid conditions. Aluminium (Al) may be stored in humid air, and so a removable layer 4 of aluminium (Al) hence is likewise very stable during jewellery processing. A removable layer 4 of polyvinyl alcohol (PVA) is easily applied and is particularly suitable for jewellery pieces 1 comprising a single large element 3.

Figure 7:
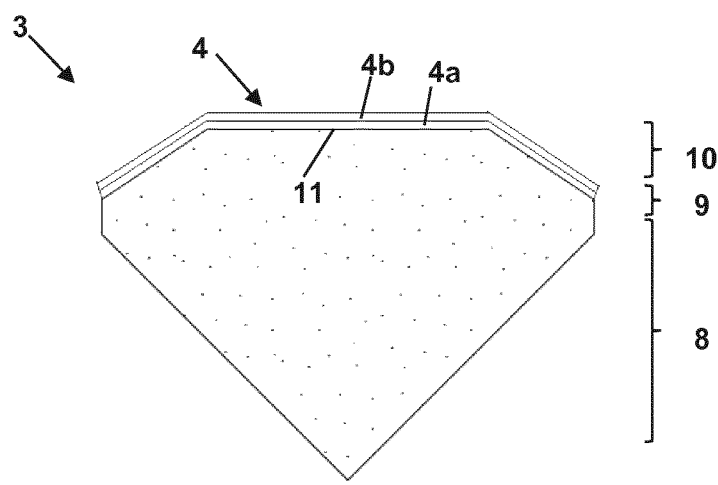
FIG. 7 is a cross-sectional view of another element coated with another removable layer.

In alternative embodiments, the removable layer may comprise multiple layers of different materials. FIG. 7 illustrates such an embodiment, in which the removable layer 4 comprises two layers, specifically an underlay 4 $a$ and an overlay 4 $b$.

Removable layers which comprise two layers or material may be beneficial since certain materials may be more preferable for allowing removable coating of the element 3, while others may provide a better outer surface, for example due to good wear resistance. For example, for the underlay 4 $a$ it may be beneficial to choose a material which both adheres well to the element 3 and is easily removed in a soaking liquid, while for the overlay 4 $b$ it may be beneficial to choose a material which provides robust protection.

Where the removable layer comprises multiple layers of material, the layers may be made from any suitable material, including those materials noted above in relation to the single layer.

In the embodiment of FIG. 7, the underlay 4 $a$ is made of a metal (A) and the overlay 4 $b$ is made of an oxide. A particularly effective removable layer 4 comprises an underlay 4 $a$ of magnesium (Mg), which adheres well to the element 3 and is easily removed in certain soaking liquids, and an overlay 4$b$ of either magnesium oxide (MgO) or silicon dioxide ($SiO_2$), which each provide robust protection to the element 3 and are resilient against water.

A removable layer 4 comprising at least two layers can also be made using PVD or CVD. In this case, the coating method may be repeated to coat the element 3 with as many layers as required. For example, PVD may be used to coat an element 3 with a magnesium (Mg) underlay 4 $a$ and a magnesium oxide (MgO) or silicon dioxide ($SiO_2$) overlay 4$b$.

If a reactive gas is present in a vacuum chamber during PVD process, the source undergoes a chemical reaction and hence the product of said chemical reaction is deposited on the element. For example, if PVD is performed with a magnesium source and with oxygen in the vacuum chamber, the element 3 is coated with a magnesium oxide (MgO) layer. An element 3 with a removable layer 4 comprising an underlay 4 $a$ of a metal (A) and an overlay 4 $b$ of an oxide of the metal ($A_XO_Y$) is therefore particularly easy to produce using PVD, since only a single source is required during deposition.

The thickness of the removable layer must be carefully determined. Thinner removable layers 4 are removed faster than thicker removable layers 4, so for speed it may be advantageous to use a thinner removable layer. However, thicker removable layers are more resilient to damage (see Examples 13 and 14 below), and so a thicker removable layer therefore provides improved protection. A compromise must therefore be struck between protection and ease of removability.

The thickness of the removable layer 4 is therefore specifically chosen and controlled be thick enough to provide robust protection to the element 3, but thin enough to be removable. During a coating of an upright 3D object with a layer of any particular material, particularly with PVD, less material is deposited on a surface as its incline to the horizontal increases. Thus, it is not usually possible to coat a 3D object completely evenly, and thickness will vary across an object.

With this in mind, throughout this application, thicknesses of layers (including the removable layer) are specified in terms of a maximum layer thickness. The maximum thickness of a layer refers to the thickness of the layer at a point on the object where the layer is thickest, usually on its horizontal faces. By specifying thicknesses of layers in terms of maximum thicknesses, a means for coating elements in approximately the same way each time is established.

To illustrate this variable thickness, Table 1 shows the thickness of removable layers when an element was coated using PVD with its table facing upwards, and such that the table was coated with a layer of magnesium (Mg) of thickness 100 nm. These values were measured using a KLA-Tencor Alpha Step 2D Contact Profilometer.

TABLE 1

| Inclination of facet with respect to the horizontal table | Facet type | Thickness of layer deposited on facet (to nearest 10 nm) |
|---|---|---|
| 0 | Table | 100 nm |
| 45 | Inclined crown facet A | 70 nm |
| 60 | Inclined crown facet B | 50 nm |
| 90 | Girdle | 10 nm |

The results show that the thickness of the coating of each facet was therefore roughly reduced by the cosine of the inclination angle to the horizontal table.

The inventors have found that particularly desirable thicknesses are as follows.

A layer of magnesium (Mg) may have a maximum thickness between approximately 25 to 200 nm, preferably approximately 100 nm. A layer of magnesium oxide (MgO) may have a maximum thickness between approximately 25 to 500 nm, preferably approximately 100 nm. A layer of silicon dioxide ($SiO_2$) may have a maximum thickness of between approximately 25 to 200 nm, preferably approximately 100 nm. A layer of aluminium (Al) may have a maximum thickness of between approximately 50 to 300 nm, preferably approximately 150 nm. A layer of polyvinyl alcohol (PVA) may have a maximum thickness of between approximately 3 μm and 7 μm, preferably approximately 5 μm.

Decorative Layer

Considering now in more detail the application of the decorative layer, before the jewellery piece 1 is coated with the decorative layer 5 degreasing of the jewellery piece 1 is often required to ensure the surface of the body 2 is grease-free and can bond effectively with the decorative layer 5.

The body 2 may be degreased using any suitable degreasing method, such as by cleaning with a degreasing liquid, for example an alcohol, acetone or petrol.

In some cases it may be appropriate to select the degreasing liquid according to the removable layer that has been applied to the element.

For example, since magnesium (Mg) is very reactive with water, a removable layer 4 of magnesium (Mg) may be damaged during a wet degreasing with alcohol or acetone. Thus, for a magnesium removable layer 4, degreasing with fresh cleaning petrol or cleaning petrol with 20% water free alcohol is recommended. Such degreasing should be done as quickly as possible.

Both a removable layer of magnesium oxide (MgO) and a removable layer 4 of magnesium (Mg) and Silicon Dioxide ($SiO_2$) are less sensitive to water. Degreasing the jewellery piece 1 first with cleaning petrol and second with a normal distilled alcohol is therefore recommended for such removable layers 4.

Turning now to the process of coating the jewellery piece 1 with a decorative layer 5, preferred options for decorative layers 5 are provided below.

Useable ranges of maximum thicknesses, as well as a preferable maximum thickness, of each decorative layer 5 are also provided. Provided also are useable ranges of maximum thicknesses, as well as a preferable maximum thickness, of each decorative sublayer of each decorative layer 5 (where appropriate). As with the removable layer 4 noted above, the thickness of the decorative layer 5 will not be constant across the article 1, and thus thicknesses are specified in terms of maximum thicknesses, so that a means for coating the articles 1 in approximately the same way each time is established.

The decorative layer 5 may be any suitable layer, such as for example a rose gold decorative layer (i.e. a gold-copper alloy layer), a diamond-like carbon (DLC) decorative layer, a titanium nitride (TiN) decorative layer, a metallic silicon decorative layer, a silicon dioxide ($SiO_2$), gold (Au), a silicon dioxide ($SiO_2$) decorative layer, a titanium carbide (TiC) decorative layer, a zirconium nitride decorative layer, a chromium (Cr) decorative layer, a gold (Au) decorative layer, a gold-copper (Au—Cu) alloy decorative layer, a silver (Ag) decorative layer, a copper (Cu) decorative layer, an iron (III) oxide $Fe_2O_3$ decorative layer, a silicon dioxide ($SiO_2$) decorative layer, or any other suitable decorative layer.

The decorative layer may be applied by any suitable method, for example using a PVD method such as sputtering.

In some cases, the decorative layer may comprise multiple sublayers arranged to give a particular effect.

For example, where the decorative layer is a rose gold decorative layer, the decorative layer may comprise i) a titanium nitride (TiN) decorative sublayer, and a gold-copper (Au—Cu) alloy decorative sublayer, or ii) a titanium nitride (TiN) decorative sublayer, a gold (Au) decorative sublayer, and a gold-copper (Au—Cu) alloy decorative sublayer. A gold-copper (Au—Cu) alloy decorative sublayer may for example be a 40:60 Au—Cu alloy.

In any case where multiple sub-layers are present, the sub-layers may be applied by successive PVD stages, for example by successive sputtering stages.

A suitable maximum thickness of the decorative layer is between approximately 25 nm and 3000 nm.

Suitable materials and approximate maximum thicknesses of various decorative layers and their decorative sublayers are shown in Table 2 below.

TABLE 2

| Decorative layer | Rose Gold (ver. 1) | Rose Gold (ver. 2) | DLC | TiN | Metallic silicon | SiO2, Au and SiO2 |
|---|---|---|---|---|---|---|
| Max. thickness range of decorative layer | 260 nm-340 nm | 250 nm-330 nm | 600 nm-700 nm | 750 nm-850 nm | 1100 nm-1300 nm | 0.5 μm-0.7 μm |
| Preferable max. thickness of decorative layer | 300 nm | 290 nm | 650 nm | 800 nm | 1200 nm | 0.6 μm |
| Material of 1$^{st}$ decorative sublayer | TiN | TiN | TiC | TiN | Si | $SiO_2$ |

TABLE 2-continued

| Decorative layer | Rose Gold (ver. 1) | Rose Gold (ver. 2) | DLC | TiN | Metallic silicon | SiO2, Au and SiO2 |
|---|---|---|---|---|---|---|
| Max. thickness range of 1$^{st}$ decorative sublayer | 130 nm-170 nm | 130 nm-170 nm | 375 nm-425 nm | 750 nm-850 nm | 1100 nm-1300 nm | 0.16 μm-0.23 μm |
| Preferable max. thickness of 1$^{st}$ decorative sublayer | 150 nm | 150 nm | 400 nm | 800 nm | 1200 nm | 0.2 μm |
| Material of 2$^{nd}$ decorative sublayer | Au—Cu alloy | Au | C | None | None | Au |
| Max. thickness range of 2$^{nd}$ decorative sublayer | 130 nm-170 nm | 30 nm-50 nm | 225 nm-275 nm | N/A | N/A | 0.16 μm-0.23 μm |
| Preferable max. thickness of 2$^{nd}$ decorative sublayer | 150 nm | 40 nm | 250 nm | N/A | N/A | 0.2 μm |
| Material of 3$^{rd}$ decorative sublayer | None | Au—Cu alloy | None | None | None | SiO$_2$ |
| Max. thickness range of 3$^{rd}$ decorative sublayer | N/A | 90 nm-110 nm | N/A | N/A | N/A | 0.16 μm-0.23 μm |
| Preferable max. thickness of 3$^{rd}$ decorative sublayer | N/A | 100 nm | N/A | N/A | N/A | 0.2 μm |

Soaking Liquid

Turning now to the soaking stage, examples of suitable soaking liquids are provided below. Where appropriate, usable ranges of concentrations, as well as a preferable concentration, of each soaking liquid are provided.

The soaking liquid may be any liquid capable of removing the removable layer, and may be for example one of the group comprising water, an acid or a base, or any other appropriate solvent.

In particular, the soaking liquid may be a citric acid solution, a nitric acid (HNO$_3$) solution, a sodium hydroxide (NaOH) solution, a Bayer Aspirin™ salicylic acid (or salicylic acid) solution, or any other appropriate solvent. The citric acid solution may be a weak citric acid solution, a strong citric acid solution, or a very strong citric acid solution. The nitric acid (HNO$_3$) solution may be a weak nitric acid (HNO$_3$) solution, a strong nitric acid (HNO$_3$) solution, or a very strong nitric acid (HNO$_3$) solution. The Bayer Aspirin™ salicylic acid (or salicylic acid) solution may be a weak Bayer Aspirin™ salicylic acid (or salicylic acid) solution, a strong Bayer Aspirin™ salicylic acid (or salicylic acid) solution.

Suitable and approximate concentrations for each soaking liquid are provided in table 3 below:

TABLE 3

| Soaking Liquid | Concentration range | Preferable concentration |
|---|---|---|
| Weak citric acid solution | 0.9 g/L-1.1 g/L | 1 g/L |
| Strong citric acid solution | 1.9 g/L-2.1 g/L | 2 g/L |
| Very strong citric acid solution | 4.9 wt %-5.1 wt % | 5 wt % |
| Weak nitric acid (HNO$_3$) solution | 1.9%-2.1% | 2% |
| Strong nitric acid (HNO$_3$) solution | 9%-11% | 10% |
| Very strong nitric acid (HNO$_3$) solution | 19%-21% | 20% |
| Sodium hydroxide (NaOH) solution | 0.04 M/L-0.06 M/L | 0.05 M/L |
| Weak Bayer Aspirin ™ salicylic acid (or salicylic acid solution) | 0.9 g/L-1.1 g/L | 1 g/L |
| Strong Bayer Aspirin ™ salicylic acid (or salicylic acid solution) | 9 g/L-11 g/L | 10 g/L |

Water is beneficial as a soaking liquid as it is readily available and non-hazardous, such that the removable layer 4 and the decorative layer 5 may be removed easily without the need for special materials. Soaking liquids such as Bayer Aspirin™ salicylic acid (or salicylic acid) solution and a citric acid solution are easily produced as Bayer Aspirins™ salicylic acid (or salicylic acid) and citrus juices are readily accessible household items.

The soaking liquid may be specially selected according to any or all of the materials of the removable layer 4, the decorative layer 5, the body 2 and the element 3.

For example, it is advantageous to soak a substantially brass or substantially bronze body 2 of a jewellery piece 1 in an alkaline solution since brass and bronze are sensitive to acids.

If the body 2 of the jewellery piece 1 is substantially made of stainless steel or aluminium (Al) and if the decorative layer 5 is resistant to a strong acid (e.g. diamond-like carbon (DLC) decorative layer, soaking the jewellery piece 1 in a very strong acid such as a 20% Nitric Acid (HNO$_3$) may be desirable to remove the removable layer 4 quickly and efficiently. However, such strong acid should not be used on a jewellery piece 1 with a rose gold decorative layer 5, as this risks discolouration of the rose gold decorative layer 5.

To speed the process of removing the removable layer, gas bubbles can be dissipated by carefully shaking the soaking liquid with the jewellery piece 1, or by applying ultrasonic waves or applying a low atmospheric solution thereto.

During transportation and storage of an element which has been coated with a removable layer 4, it is often advantageous to limit the exposure of the removable layer to moisture and condensed water. This is especially advantageous if the removable layer 4 dissolves or decomposes readily when in contact with water. To limit exposure to moisture and condensed water, it may be preferable to enclose the element 4 with the removable layer 4 in gas-tight packaging.

Variants

Although in the embodiments described above the element-receiving region is a cavity and the projection is a prong, this need not be the case. For example, element-receiving region may be any suitable means in which the element 3 may be placed, and the one or more projections may be any suitable means for securing the element 3 to the body 2 of the jewellery piece 1 including, for example, a bezel edge.

The body may be provided with any number of elements received in any number of element-receiving regions. In this case, at least one projection may be provided for each element-receiving regions to secure each of the plurality of elements separately to the body.

Many other variations are possible without departing from the scope of the invention as set out in the claims.

EXAMPLES

The method according to the invention is now described with reference to following tried and tested examples, in which various articles, elements, removable layers, decorative layers and soaking liquids were used.

For each example, the resulting jewellery piece featured a flawless decorative layer across the entirety of the jewellery piece, including on the projections that were deformed over the element to secure the element to the body during the setting process. The element(s) in each example remained intact throughout and at the end of the process each element was free from any decorative layer or any removable layer.

Example 1

In the first example, an element in the form of a 1.5 mm cubic zirconia (CZ) stone with a brilliant cut was coated with a removable layer comprising an underlay of magnesium (Mg), and an overlay of magnesium oxide (MgO).

Magnesium was first deposited onto the CZ stone by means of magnetron sputtering in a vacuum chamber, using an FHR.Line.400.H sputter coater in pulsed DC mode. Next, using the FHR.Line.400.H sputter coater in reactive mode, oxygen was then introduced into the vacuum chamber during a second deposition phase to deposit the overlay of magnesium oxide (MgO)

Both the magnesium (Mg) underlay and the magnesium oxide (MgO) overlay had a maximum thickness of approximately 100 nm, making a total maximum thickness of approximately 200 nm.

The CZ stone with the magnesium (Mg) and magnesium oxide (MgO) removable layer was set into one of twenty eight cavities of a body of a jewellery element, the body being made of computer numerical control (CNC) milled stainless steel body. The prongs of the body were then closed with a steel prong pusher.

The jewellery piece, including the CZ stone and the stainless steel body, was then coated with a rose gold decorative layer.

To coat the body with the rose gold decorative layer, the jewellery piece was first coated with a titanium nitride (TiN) decorative sublayer with a maximum thickness of approximately 150 nm and subsequently coated with a gold-copper (Au—Cu) alloy decorative sublayer with a maximum thickness of approximately 150 nm. The total maximum thickness of the rose gold decorative layer was therefore approximately 300 nm. Coating was carried out by sputtering.

The jewellery piece was then soaked for approximately two hours in a strong citric acid solution with a concentration of approximately 2 g/L (i.e. approximately 2 g of citric acid dissolved in 1 L of water). This soaking removed the removable layer and the rose gold decorative layer from the CZ stone. The CZ stone was then cleaned by exposing it to a jet of water.

Example 2

A second example was substantially the same as the first example, except for the soaking step.

In this soaking step, to remove the removable layer and the rose gold decorative layer from the CZ stone, the jewellery piece was soaked for approximately three hours in weak Bayer Aspirin™ salicylic acid (or salicylic acid) solution with a concentration of approximately 1 g/L (approximately 500 mg of Bayer Aspirin™ salicylic acid (or salicylic acid) dissolved in 500 ml of water).

Example 3

A third example was substantially the same as the first example, except for the soaking step.

In this soaking step, to remove the removable layer and the rose gold decorative layer from the CZ stone, the jewellery piece was soaked for approximately twenty hours in water. Soaking in water was found to be effective in removing the removable layer, though a longer soaking time was required than when using citric acid or Bayer Aspirin™ salicylic acid (or salicylic acid) solution.

Example 4

A fourth example was substantially the same as the first example except that the removable layer comprised an underlay of magnesium (Mg) and an overlay of silicon dioxide ($SiO_2$), deposited using the FHR.Line.400.H sputter coater.

The element was set in a jewellery piece, the jewellery piece was coated with a rose gold decorative layer, and the removable layer and decorative layer were removed from the element in the manner already described in relation Example 1.

Example 5

A fifth example was substantially the same as the fourth example, except for the soaking step.

In this soaking step, to remove the removable layer and the rose gold decorative layer from the CZ stone, the jewellery piece was soaked for approximately three hours in weak Bayer Aspirin™ salicylic acid (or salicylic acid)

solution with a concentration of approximately 1 g/L (approximately 500 mg of Bayer Aspirin™ salicylic acid (or salicylic acid) dissolved in 500 ml of water.

Example 6

A sixth example was substantially the same as the fourth example, except for the soaking step.

In this soaking step, to remove the removable layer and the rose gold decorative layer from the CZ stone, the jewellery piece was soaked for approximately twenty hours in water.

Example 7

In a seventh example, an element in the form of a precious stone was coated by sputtering with a removable layer of magnesium oxide (MgO) with a maximum thickness of approximately 100 nm. The precious stone with the removable layer of magnesium oxide (MgO) was then set into a body made of stainless steel.

The jewellery piece, including the precious stone and the stainless steel body, was then coated by sputtering with a diamond-like carbon (DLC) decorative layer. This was achieved by coating the jewellery piece first with a titanium carbide (TiC) decorative sublayer with maximum thickness of approximately 400 nm, and second with a carbon (C) decorative sublayer with maximum thickness of approximately 250 nm.

The jewellery piece was soaked in a 20% Nitric Acid ($HNO_3$) solution for approximately 3 hours, after which the removable layer of magnesium oxide (MgO) and the diamond-like carbon (DLC) decorative layer has been removed from the precious stone. The precious stone was then cleaned by exposing it to a jet of water.

Example 8

An eighth example was substantially the same as the seventh example except that the element was coated by sputtering with a removable layer comprising underlay of magnesium (Mg), and an overlay of silicon dioxide ($SiO_2$). The magnesium (Mg) and the silicon dioxide ($SiO_2$) layers each had a maximum thickness of approximately 100 nm.

Example 9

In a ninth example of the invention, six 1.5 mm precious stones were coated as follows:
two stones were coated by sputtering with a removable layer of magnesium (Mg) (with a maximum thickness of approximately 100 nm);
two stones were coated by sputtering with a removable layer comprising an underlay of magnesium (Mg) (with a maximum thickness of approximately 100 nm) and an overlay of magnesium oxide (MgO) (with a maximum thickness of approximately 100 nm); and
two stones were coated by sputtering with a removable layer comprising an underlay of magnesium (Mg) (with a maximum thickness of approximately 100 nm), and an overlay of silicon dioxide ($SiO_2$) (with a maximum thickness of approximately 100 nm).

All six precious stones were then set into a milled stainless steel body comprising ten cavities. This was achieved by placing each precious stone in a cavity and closing the prongs associated with each cavity over the precious stone so as to secure the precious stone to the body.

Before setting each precious stone 3 into each cavity 6, care was taken to keep the body 2 of the jewellery piece 1 clean. This was done by degreasing the body with ethanol and rinsing it with deionised water. This precluded any need for chemical cleaning of the jewellery piece after the setting stage and before the jewellery piece was coated with the decorative layer.

The jewellery piece, including the precious stones and the body, was then coated by sputtering with a titanium nitride (TiN) decorative layer by means of an FHR.Line.400.H sputter coater. This process included an argon plasma treatment, followed by deposition of 800 m of titanium nitride (TiN) onto the jewellery piece by means of magnetron sputtering in the vacuum chamber of the FHR.Line.400.H sputter coater.

A soaking liquid was made by dissolving 0.5 g of critic acid into 0.5 L of water to provide a weak citric acid solution with a concentration of approximately 1 g/L. The jewellery piece was then soaked in the soaking liquid.

After soaking, all the removable layers and decorative layers were effectively removed from all the precious stones.

Example 10

In a tenth example, an element in the form of a 1.5 mm cubic zirconia (CZ) stone, was coated with a removable layer of carbon in the form of candle soot, before being set into a stainless steel body of a jewellery piece. Care was taken to preclude any damage to the candle soot removable layer when the prongs of the body were closed.

The jewellery piece, including the CZ stone and the stainless steel body, was then coated with a titanium nitride (TiN) decorative layer by means of reactive magnetron sputtering in the FHR.Line.400.H sputter coater. The removable layer of candle soot and the titanium nitride (TiN) decorative layer were then removed from the CZ stone by cleaning the CZ stone with soap and water.

A carbon layer provided by candle soot may be particularly suitable for sensitive jewellery materials and sensitive decorative layers.

Example 11

In a eleventh example, an element in the form of a 1.5 mm cubic zirconia (CZ) stone was coated, by means of sputtering, with a removable layer of aluminium (Al) with a maximum thickness of approximately 150 nm. The CZ stone was then set into a cavity of a brass body.

The jewellery piece, comprising the CZ stone and the body, was then coated by sputtering with a titanium nitride (TiN) decorative layer using the method already described in relation to Example 9. The jewellery piece was then soaked in a 0.05M NaOH solution at 50° C. for approximately two hours. The CZ stone was then cleaned by exposing it to a jet of water. The removable layer of aluminium (Al) and the titanium nitride (TiN) decorative layer was completely removed from the cubic zirconia (CZ) stone in doing so.

Example 12

A twelfth example was substantially the same as the eleventh example except that a 1.5 mm cubic zirconia (CZ) stone with a removable layer of aluminium (Al) was set into a cavity of a bronze body.

Example 13

In a thirteenth example, an element in the form of a precious stone was coated with a removable layer of magnesium with a maximum thickness of approximately 25 nm. The previous stone was then set into a body. The jewellery piece, comprising the precious stone and the body, was then coated with a titanium nitride (TiN) decorative layer. In soaking the jewellery piece in a strong Bayer Aspirin™ salicylic acid (or salicylic acid) solution with a concentration of approximately 10 g/L (500 mg of Bayer Aspirin™ salicylic acid (or salicylic acid) dissolved into 50 ml of warm water), the magnesium removable layer and the decorative layer were completely removed from the precious stone.

Example 14

A fourteenth example was substantially the same as the twelfth example except that a precious stone was covered with a removable layer of magnesium with a maximum thickness of approximately 200 nm.

Example 15

In a fifteenth example, an element in the form of a 6 mm cubic zirconia (CZ) stone was sputter coated with a removable layer of magnesium (Mg) with a maximum thickness of approximately 100 nm. The CZ stone was then set into a bezel cavity of a body of a jewellery piece by deforming the associated bezel edge so as to secure the CZ stone to the body.

The jewellery piece, comprising the cubic zirconia (CZ) stone and the body, was then coated with a metallic silicon decorative layer with a maximum thickness of approximately 1200 nm by means of the FHR.Line.400.H sputter coater.

The jewellery piece was then soaked in water for 24 hours. The removable layer of magnesium (Mg) and the metallic silicon decorative layer was completely removed from the CZ stone in doing so.

Example 16

In a sixteenth example, an element in the form of a 17.5×13 mm oval glass rhinestone was first coated with a removable layer of polyvinyl alcohol (PVA) as follows. First an approximately 3% polyvinyl alcohol (PVA) solution was created, the rhinestone element was then heated to approximately 100° C. and immersed several times in the approximately 3% polyvinyl alcohol (PVA) solution so as to coat the rhinestone element. Immediately thereafter, the coated rhinestone element was then dried in a drying oven at approximately 105° C.

The rhinestone element with the removable layer of polyvinyl alcohol (PVA) was then placed into a cavity of a brass body. The prongs of the brass body were then closed with a steel prong pusher so as to secure the rhinestone element to the body.

The jewellery piece, including the rhinestone element and the body, was then coated with a pinkish silicon dioxide ($SiO_2$), gold (Au) and silicon dioxide ($SiO_2$) decorative layer with a maximum thickness of approximately 0.6 µm in an Evatec evaporation coater. This was achieved by coating the jewellery piece first with a first silicon dioxide ($SiO_2$) decorative sublayer, second with a gold (Au) decorative sublayer, and third with a second silicon dioxide ($SiO_2$) decorative sublayer. The jewellery piece was then soaked in water for 5 minutes. After soaking, the removable layer of polyvinyl alcohol (PVA) and the silicon dioxide ($SiO_2$), gold (Au) and silicon dioxide ($SiO_2$) decorative layer was removed from the rhinestone element.

Examples 17 and 18

In the following two examples, dropping and scraping tests were carried out to test the protective capabilities of a removable layer e.g. during the transportation or storage of an isolated element, during the setting of the element into the body of the jewellery piece, or during the transportation or the storage of the completed jewellery piece Example 17

A "dropping" test was carried out on a 2 mm cubic zirconia (CZ) stone which had been coated with a removable layer of magnesium (Mg) with a maximum thickness of approximately 230 nm. The cubic zirconia (CZ) stone was dropped from height of 1 m onto an 8 mm quartz glass plate five times. Thereafter, the dropped cubic zirconia (CZ) stone was inspected for defects. A sixfold magnification of the dropped cubic zirconia (CZ) stone was used for the quality inspection. At this magnification, the removable layer of magnesium coating appeared undamaged by the drop, and hence the 2 mm cubic zirconia (CZ) stone thereunder had been protected in the drop by the removable magnesium layer.

Example 18

A "scraping" test was also carried out on a different 3 mm cubic zirconia (CZ) stone which had been coated with a removable layer of magnesium (Mg) with a maximum thickness of approximately 380 nm. The removable layer of magnesium coating was scraped with a steel needle so as to introduce small regions in which the removable layer was compromised and the surface of the element was exposed.

The cubic zirconia (CZ) stone with the scraped removable layer of magnesium coating was then coated with iron (III) oxide ($Fe_2O_3$) by means of physical vapour deposition (PVD). While the magnesium layer shielded the majority of the element, in the small regions where the surface of the element was exposed, the $Fe_2O_3$ decorative layer was deposited directly onto the element.

The cubic zirconia (CZ) stone was then soaked in a 5% Nitric Acid ($HNO_3$) solution for 3 minutes. After soaking, the iron (III) oxide ($Fe_2O_3$) coating was absent from the entire cubic zirconia (CZ) stone, i.e. including both the areas where the removable layer of magnesium (Mg) still persisted and the areas where the removable layer of magnesium (Mg) had been scraped off such that the $Fe_2O_3$ had coated the element directly.

A comparative test showed that if a cubic zirconia (CZ) stone is coated directly in the iron (III) oxide ($Fe_2O_3$) coating without any removable layer and is then soaked in a 5% Nitric Acid ($HNO_3$) solution, the iron (III) oxide ($Fe_2O_3$) coating is not removed after soaking.

This shows that not only does the removable layer allow the decorative $Fe_2O_3$ to be removed effectively from the CZ stone, but that such removal is possible even when the removable layer of magnesium coating has been compromised in small areas. That is, the removable layer does not lose its desired shielding effect by the sort of deficiencies that may occur during transportation or setting of such elements

ADDITIONAL COMBINATIONS

As previously noted, it may be desirable to select an appropriate soaking liquid according to the particular decorative layer and/or the particular body material of the jewellery piece, so as to ensure that the soaking liquid does not affect the quality or appearance of the decorative layer or the body. It may also be appropriate to select a removable layer that can be removed using an appropriate soaking liquid.

Tables 2 to 7 below set out appropriate combinations of removable layers and soaking liquids for particular body materials and decorative layers.

TABLE 4

| Body Material | DLC (TIC, C) Decorative Layer | | TiC Decorative Layer | |
|---|---|---|---|---|
| | Removable Layer | Soaking Liquid (conc.) | Removable Layer | Soaking Liquid (conc.) |
| stainless steel | Mg, SiO$_2$ | HNO$_3$ (2%) solution | Mg, SiO$_2$ | HNO$_3$ (2%) solution |
| titanium | Mg, SiO$_2$ | HNO$_3$ (2%) solution | Mg, SiO$_2$ | HNO$_3$ (2%) solution |
| aluminum | Mg, SiO$_2$ | HNO$_3$ (2%) solution | Mg, SiO$_2$ | HNO$_3$ (2%) solution |
| bronze | Mg, SiO$_2$ | salicylic acid solution | Mg, SiO$_2$ | salicylic acid solution |
| brass | — | — | — | salicylic acid solution |
| polyamides | — | — | — | — |

TABLE 5

| Body Material | TiN Decorative Layer | | ZrN Decorative Layer | |
|---|---|---|---|---|
| | Removable Layer | Soaking Liquid (conc.) | Removable Layer | Soaking Liquid (conc.) |
| stainless steel | MgO | HNO$_3$ (2%) solution | Mg, SiO$_2$ | HNO$_3$ (2%) solution |
| titanium | Mg, SiO$_2$ | HNO$_3$ (2%) solution | Mg, SiO$_2$ | HNO$_3$ (2%) solution |
| aluminum | Mg, SiO$_2$ | HNO$_3$ (2%) solution | Mg, SiO$_2$ | HNO$_3$ (2%) solution |
| bronze | Mg, SiO$_2$ | salicylic acid solution | Mg, SiO$_2$ | salicylic acid solution |
| brass | Mg, SiO$_2$ | salicylic acid solution | Mg, SiO$_2$ | salicylic acid solution |
| polyamides | — | — | — | — |

TABLE 6

| Body Material | Cr Decorative Layer | | Au Decorative Layer | |
|---|---|---|---|---|
| | Removable Layer | Soaking Liquid (conc.) | Removable Layer | Soaking Liquid (conc.) |
| stainless steel | Mg, SiO$_2$ | HNO$_3$ (2%) solution | Mg, SiO$_2$ | HNO$_3$ (2%) solution |
| titanium | Mg, SiO$_2$ | HNO$_3$ (2%) solution | Mg, SiO$_2$ | HNO$_3$ (2%) solution |
| aluminum | Mg, SiO$_2$ | HNO$_3$ (2%) solution | Mg, SiO$_2$ | HNO$_3$ (2%) solution |
| bronze | Mg, SiO$_2$ | salicylic acid solution | Mg, SiO$_2$ | salicylic acid solution |
| brass | Mg, SiO$_2$ | salicylic acid solution | Mg, SiO$_2$ | salicylic acid solution |
| polyamides | Mg, SiO$_2$ | citric acid (5 wt %) solution | Mg, SiO$_2$ | citric acid (5 wt %) solution |

TABLE 7

| Body Material | Au—Cu alloy Decorative Layer | | Ag Decorative Layer | |
|---|---|---|---|---|
| | Removable Layer | Soaking Liquid (conc.) | Removable Layer | Soaking Liquid (conc.) |
| stainless steel | Mg, SiO$_2$ | salicylic acid solution | Mg, SiO$_2$ | salicylic acid solution |
| titanium | Mg, SiO$_2$ | salicylic acid solution | Mg, SiO$_2$ | salicylic acid solution |
| aluminum | Mg, SiO$_2$ | salicylic acid solution | Mg, SiO$_2$ | salicylic acid solution |
| bronze | Mg, SiO$_2$ | salicylic acid solution | Mg, SiO$_2$ | salicylic acid solution |
| brass | Mg, SiO$_2$ | salicylic acid solution | Mg, SiO$_2$ | salicylic acid solution |
| polyamides | Mg, SiO$_2$ | salicylic acid solution | Mg, SiO$_2$ | salicylic acid solution |

TABLE 8

| Body Material | Cu Decorative Layer | | Fe$_2$O$_3$ Decorative Layer | |
|---|---|---|---|---|
| | Removable Layer | Soaking Liquid (conc.) | Removable Layer | Soaking Liquid (conc.) |
| stainless steel | Mg, SiO$_2$ | salicylic acid solution | Mg | salicylic acid solution |
| titanium | Mg, SiO$_2$ | salicylic acid solution | Mg | salicylic acid solution |
| aluminum | Mg, SiO$_2$ | salicylic acid solution | Mg | salicylic acid solution |
| bronze | Mg, SiO$_2$ | salicylic acid solution | Mg | salicylic acid solution |
| brass | Mg, SiO$_2$ | salicylic acid solution | Mg | salicylic acid solution |
| polyamides | Mg, SiO$_2$ | salicylic acid solution | Mg | salicylic acid solution |

TABLE 9

| Body Material | SiO$_2$ Decorative Layer | |
|---|---|---|
| | Removable Layer | Soaking Liquid (conc.) |
| stainless steel | Mg | salicylic acid solution |
| titanium | Mg | salicylic acid solution |
| aluminum | Mg | salicylic acid solution |
| bronze | Mg | salicylic acid solution |
| brass | Mg | salicylic acid solution |
| polyamides | Mg | salicylic acid solution |

The invention claimed is:

1. A method of making an article, the article comprising a body having a cavity, a projection and a decorative layer, and an element set into the cavity of the body, wherein the projection is closable over the cavity, the method comprising:
   providing the element, the element being selected from the group consisting of: cubic zirconia (CZ), glass, a rhinestone, a semi-precious stone, and a precious stone and the element being at least partially coated with a removable layer,
   placing the element with the removable layer into the cavity of the body and closing the projection over the element,
   coating the element, including the removable layer, and the body with the decorative layer, wherein the decorative layer is applied via physical vapor deposition, and removing the removable layer and the decorative layer from the element, wherein the removing of the removable layer and the decorative layer from the element comprises soaking the element in a soaking liquid.

2. The method of claim 1 wherein the removable layer comprises a layer selected from the group of: a metal layer, an oxide layer, a layer of polyvinyl alcohol (PVA) or a layer of carbon.

3. The method of claim 1, wherein the removable layer comprises at least two layers.

4. The method of claim 3, wherein each layer of the removable layer is selected from the group consisting of: a layer of magnesium (Mg), a layer of magnesium oxide (MgO), and a layer of silicon dioxide (SiO2).

5. The method of claim 1, wherein at least partially coating the element with the removable layer comprises:
coating the element with a layer of a metal, and
coating the element with a layer of an oxide.

6. The method of claim 5, wherein the oxide is an oxide of the metal or silicon dioxide (SiO2).

7. The method of claim 1, wherein the removable layer has a maximum thickness between 5 nm and 7 μm.

8. The method of claim 1, wherein the decorative layer is selected from the group consisting of: a rose gold decorative layer; a diamond-like carbon (DLC) decorative layer; a titanium nitride (TiN) decorative layer; a metallic silicon decorative layer; a titanium carbide (TiC) decorative layer; a zirconium nitride decorative layer; a chromium (Cr) decorative layer; a gold (Au) decorative layer; a gold-copper (Au—Cu) alloy decorative layer; a silver (Ag) decorative layer; a copper (Cu) decorative layer; an iron (III) oxide Fe2O3 decorative layer; or a silicon dioxide (SiO2) decorative layer.

9. The method of claim 1, wherein the soaking liquid is water, an acid or a base.

10. The method of claim 1, further comprising cleaning the element after the step of removing the removable layer and the decorative layer from the element.

11. The method of claim 1, wherein the element is a jewellery element.

12. The method of claim 1, wherein the article is a jewellery piece.

13. The method of claim 2, wherein the metal layer is a layer of magnesium (Mg) or a layer of aluminium (Al).

14. The method of claim 2, wherein the oxide layer is a layer of magnesium oxide (MgO) or a layer of silicon dioxide ($SiO_2$).

15. The method of claim 1, wherein the soaking liquid is selected from the group consisting of: water, a citric acid solution, a nitric acid ($HNO_3$) solution, a sodium hydroxide (NaOH) solution, and a salicylic acid solution.

16. The method of claim 1, wherein the decorative layer comprises a silicon dioxide (SiO2) sub-layer, a gold (Au) sub-layer, and a silicon dioxide (SiO2) sub-layer.

* * * * *